(12) United States Patent
Wang et al.

(10) Patent No.: US 11,632,888 B2
(45) Date of Patent: Apr. 18, 2023

(54) RRAM STRUCTURE WITH ONLY PART OF VARIABLE RESISTIVE LAYER COVERING BOTTOM ELECTRODE AND METHOD OF FABRICATING THE SAME

(71) Applicant: UNITED MICROELECTRONICS CORP., Hsin-Chu (TW)

(72) Inventors: Wen-Jen Wang, Tainan (TW); Chun-Hung Cheng, Kaohsiung (TW); Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/571,519

(22) Filed: Jan. 9, 2022

(65) Prior Publication Data

US 2022/0130903 A1     Apr. 28, 2022

Related U.S. Application Data

(62) Division of application No. 16/794,194, filed on Feb. 18, 2020, now Pat. No. 11,257,864.

(30) Foreign Application Priority Data

Jan. 14, 2020 (CN) .......................... 202010035925.5

(51) Int. Cl.
*H10B 63/00* (2023.01)
*H10N 70/00* (2023.01)
*H01L 51/56* (2006.01)

(52) U.S. Cl.
CPC .......... *H10B 63/30* (2023.02); *H10N 70/063* (2023.02); *H10N 70/826* (2023.02)

(58) Field of Classification Search
CPC ........................... H01L 27/2436; H01L 51/56
See application file for complete search history.

(56) References Cited

U.S. PATENT DOCUMENTS

| | | | |
|---|---|---|---|
| 8,552,412 B2 | 10/2013 | Park | |
| 9,799,705 B1 | 10/2017 | Yi | |
| 10,090,465 B2 | 10/2018 | Hsu | |
| 10,157,951 B2 | 12/2018 | Kim | |
| 10,566,519 B2 | 2/2020 | Chen | |
| 10,686,014 B2 | 6/2020 | Li | |
| 2006/0197130 A1* | 9/2006 | Suh | ........................ H01L 45/148 257/296 |

(Continued)

OTHER PUBLICATIONS

Chou, the specification, including the claims, and drawings in the U.S. Appl. No. 16/576,784, filed Sep. 20, 2019.

*Primary Examiner* — Caleb E Henry
(74) *Attorney, Agent, or Firm* — Winston Hsu (57) ABSTRACT

An RRAM structure includes a substrate. The substrate is divided into a memory cell region and a logic device region. A metal plug is disposed within the memory cell region. An RRAM is disposed on and contacts the metal plug. The RRAM includes a top electrode, a variable resistive layer, and a bottom electrode. The variable resistive layer is disposed between the top electrode and the bottom electrode. The variable resistive layer includes a first bottom surface. The bottom electrode includes a first top surface. The first bottom surface and the first top surface are coplanar. The first bottom surface only overlaps and contacts part of the first top surface.

3 Claims, 6 Drawing Sheets (56) References Cited

U.S. PATENT DOCUMENTS

| | | | |
|---|---|---|---|
| 2006/0226411 A1* | 10/2006 | Lee | H01L 45/12 |
| | | | 257/E45.002 |
| 2006/0278863 A1* | 12/2006 | Chang | H01L 45/1675 |
| | | | 257/E21.538 |
| 2011/0147692 A1* | 6/2011 | Park | H01L 45/06 |
| | | | 257/E45.001 |
| 2014/0024195 A1* | 1/2014 | Park | H01L 45/1683 |
| | | | 438/382 |
| 2014/0203236 A1* | 7/2014 | Chen | H01L 45/1246 |
| | | | 257/4 |
| 2014/0217373 A1* | 8/2014 | Youn | H05K 1/0281 |
| | | | 438/23 |
| 2015/0036300 A1* | 2/2015 | Park | H05K 1/14 |
| | | | 156/212 |
| 2015/0103500 A1* | 4/2015 | Bae | H05K 1/111 |
| | | | 228/102 |
| 2016/0172428 A1* | 6/2016 | Song | H01L 27/3276 |
| | | | 257/40 |
| 2016/0248008 A1* | 8/2016 | Chen | H01L 45/16 |
| 2017/0117467 A1 | 4/2017 | Chang | |
| 2018/0108837 A1* | 4/2018 | Hsu | H01L 45/04 |
| 2018/0301520 A1* | 10/2018 | Jin | H01L 27/3223 |
| 2018/0351099 A1* | 12/2018 | Yang | H01L 27/2436 |
| 2019/0281699 A1* | 9/2019 | Bae | H05K 1/111 |
| 2021/0036057 A1* | 2/2021 | Hsieh | H01L 45/08 |

\* cited by examiner

RRAM STRUCTURE WITH ONLY PART OF VARIABLE RESISTIVE LAYER COVERING BOTTOM ELECTRODE AND METHOD OF FABRICATING THE SAME

CROSS REFERENCE TO RELATED APPLICATIONS

This application is a division of U.S. application Ser. No. 16/794,194, filed on Feb. 18, 2020. The content of the application is incorporated herein by reference.

BACKGROUND OF THE INVENTION

1. Field of the Invention

The present invention relates to a resistive random access memory (RRAM) structure and a method of fabricating the same; more particularly to an RRAM structure with a top electrode only covering part of a bottom electrode.

2. Description of the Prior Art

Nonvolatile memory is capable of retaining the stored information even when unpowered. Non-volatile memory may be used for secondary storage or long-term persistent storage. RRAM technology has been gradually recognized as having exhibited those semiconductor memory advantages.

RRAM cells are non-volatile memory cells that store information by changes in electric resistance, not by changes in charge capacity. In general, the resistance of the resistive layer varies according to an applied voltage. An RRAM cell can be in a plurality of states in which the electric resistances are different. Each different state may represent a digital information. The state can be changed by applying a predetermined voltage or current between the electrodes. A state is maintained as long as a predetermined operation is not performed.

However, the height of the metal interconnections and the thickness of the inter-metal dielectrics within the logic device region are influenced due to fabricate the RRAM by a conventional process. Therefore, the capacitance and the resistance of the metal interconnections within the logic device region may be different from the original design.

SUMMARY OF THE INVENTION

In light of the above, the present invention provides a method of fabricating an RRAM structure which does not influence the original designed height of the metal interconnections within the logic device.

According to a preferred embodiment of the present invention, an RRAM structure includes a substrate divided into a memory cell region and a logic device region. A metal plug is disposed within the memory cell region. An RRAM is disposed on and contacts the metal plug, wherein the RRAM includes a top electrode, a variable resistive layer, and a bottom electrode, the variable resistive layer is disposed between the top electrode and the bottom electrode, the variable resistive layer includes a first bottom surface, the bottom electrode includes a first top surface, the first bottom surface and the first top surface are coplanar and the first bottom surface only overlaps and contacts part of the first top surface.

According to another preferred embodiment of the present invention, a fabricating method of an RRAM structure includes providing a metal dielectric disposed on a substrate. Next, a metal plug is formed to penetrate the metal dielectric. Later, a dielectric is formed to cover the metal dielectric. After that, an opening is formed in the dielectric and the metal plug is exposed from the opening. Subsequently, a bottom electrode is formed to cover the dielectric and the bottom electrode fills up the opening. After that, a planarization process is performed to remove the bottom electrode outside of the opening. Next, after the planarization process, a variable resistive layer is formed to cover the bottom electrode. Finally, a top electrode is formed cover the variable resistive layer, wherein the variable resistive layer has a bottom surface, the bottom electrode has a top surface, the bottom surface and the top surface are coplanar, and the bottom surface only partly overlaps the top surface.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 to FIG. 10 depict a fabricating method of an RRAM structure according to a preferred embodiment of the present invention, wherein:

DETAILED DESCRIPTION

Figure 1:
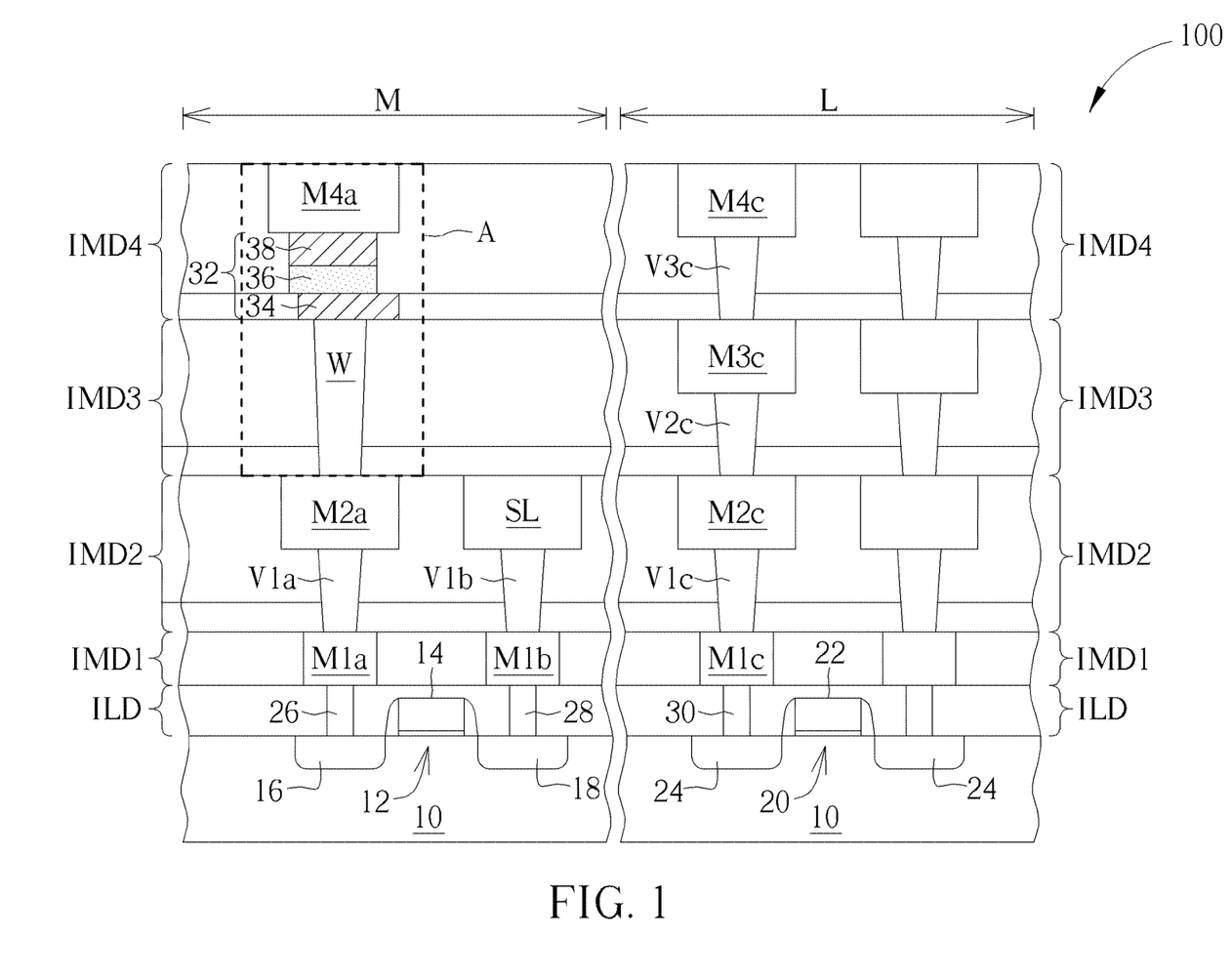
FIG. 1 depicts an RRAM structure according to a preferred embodiment of the present invention.
Figure 2:
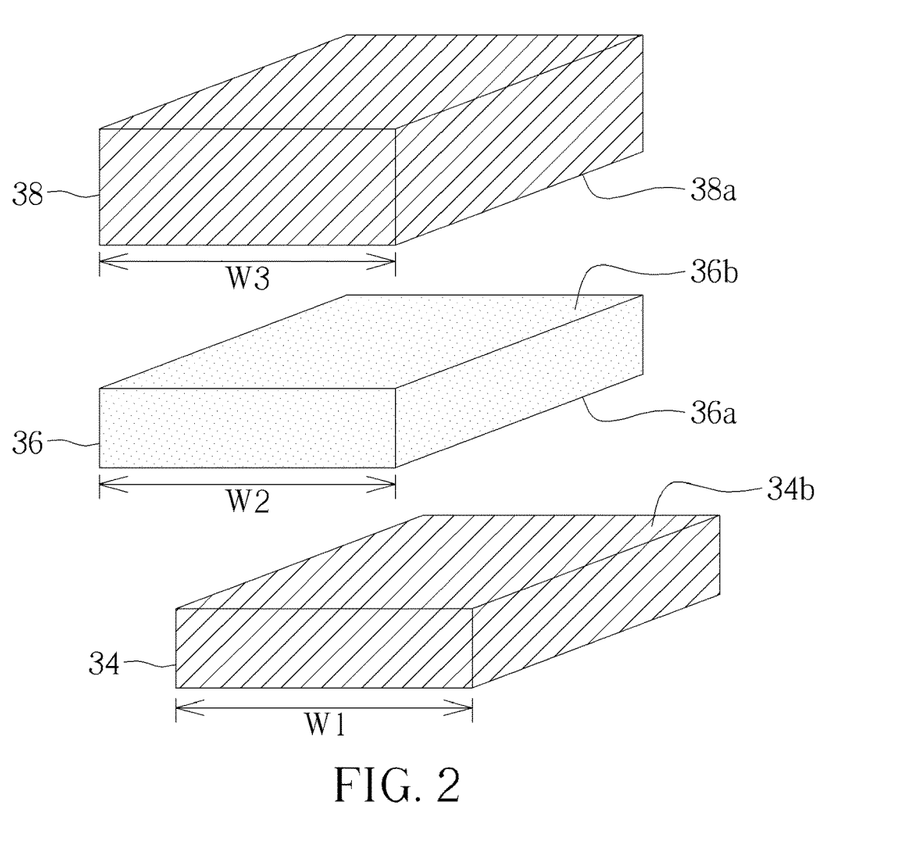
FIG. 2 depicts an exploded view of an RRAM in FIG. 1.
Figure 3:
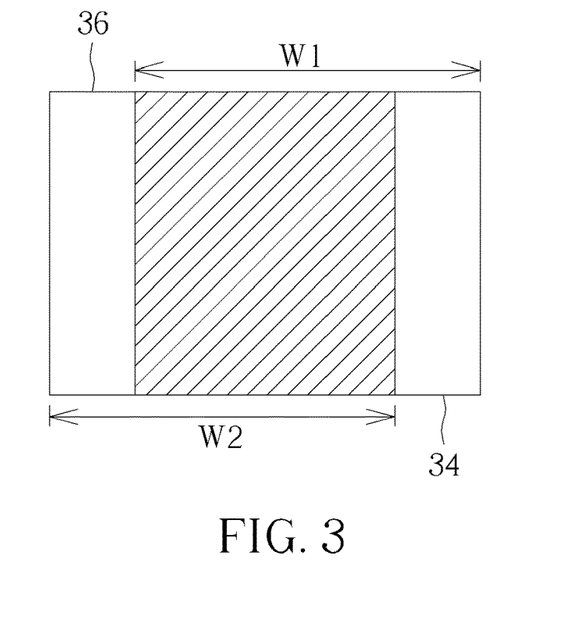
FIG. 3 depicts top views of a bottom electrode and a variable resistive layer in FIG. 1.

FIG. 1 depicts an RRAM structure according to a preferred embodiment of the present invention. FIG. 2 depicts an exploded view of an RRAM in FIG. 1. FIG. 3 depicts top views of a bottom electrode and a variable resistive layer in FIG. 1.

As shown in FIG. 1, an RRAM structure 100 includes a substrate 10. The substrate 10 is divided into a memory cell region M and a logic device region L. A transistor 12 is disposed within the memory cell region M of the substrate 10. The transistor 12 includes a gate structure 14, a drain 16 and a source 18. A transistor 20 is disposed within the logic device region L of the substrate 10. The transistor 20 includes a gate structure 22 and two source/drain doped regions 24. An interlayer dielectric ILD covers the memory cell region M, the logic device region L of the substrate 10, the transistor 12 and the transistor 20. A first metal dielectric IMD1 contacts and covers the interlayer dielectric ILD. A second metal dielectric IMD2 contacts and covers the first metal dielectric IMD1. A third metal dielectric IMD3 contacts and covers the second metal dielectric IMD2. A fourth metal dielectric IMD4 contacts and covers the third metal dielectric IMD3.

A drain plug 26 penetrates the interlayer dielectric ILD and contacts the drain 16. A source plug 28 penetrates the interlayer dielectric ILD contacts the source 18. A plug 30 penetrates the interlayer dielectric ILD and contacts one of the source/drain doped regions 24. A first drain metal layer M1a and a first source metal layer M1b are embedded in the first metal dielectric IMD1 within the memory cell region M. A first metal layer M1c is embedded in the first metal dielectric IMD1 within the logic device region L. The first drain metal layer M1a contacts the drain plug 26. The first source metal layer M1b contacts the source plug 28. The first metal layer M1c contacts the plug 30. The thickness of the first metal dielectric IMD1 within the memory cell region M is the same as the thickness of the first metal dielectric IMD1 within the logic device region L.

A first drain plug V1a, a second drain metal layer M2a, a first source plug V1b and a source line SL are embedded in the second metal dielectric IMD2 within the memory cell region M. A first plug V1c and a second metal layer M2c are embedded in the second metal dielectric IMD2 within the logic device region L. The thickness of the second metal dielectric IMD2 within the memory cell region M is the same as the thickness of the second metal dielectric IMD2 within the logic device region L. The first drain plug V1a contacts the first drain metal layer M1a. The second drain metal layer M2a contacts the first drain plug V1a. A first source plug V1b contacts the first source metal layer M1b. The source line SL contacts the first source plug V1b. The first plug V1c contacts the first metal layer M1c. The second metal layer M2c contacts the first plug V1c.

A metal plug W is disposed in the third metal dielectric IMD3 within the memory cell region M. A second plug V2c and a third metal layer M3c are disposed in the third metal dielectric IMD3 within the logic device region L. The metal plug W contacts the second drain metal layer M2a. The second plug V2c contacts the second metal layer M2c. The third metal layer M3c contacts the second plug V2c.

An RRAM 32 is disposed in the fourth metal dielectric IMD4 within the memory cell region M, and the RRAM 32 contacts the metal plug W. The RRAM 32 includes a top electrode 38, a variable resistive layer 36 and a bottom electrode 34. The variable resistive layer 36 is disposed between the top electrode 38 and the bottom electrode 34. Please refer to FIG. 1, FIG. 2 and FIG. 3, the variable resistive layer 36 includes a first bottom surface 36a. The first bottom surface 36a and the top surface of the substrate 10 are parallel. The bottom electrode 34 includes a first top surface 34b. The first bottom surface 36a and the first top surface 34b may have the same shape and the same area, and the first bottom surface 36a and the first top surface 34b are coplanar. As shown in FIG. 3, the first bottom surface 36a only partly overlaps and contacts the first top surface 34b. The slashes in FIG. 3 which go from left to right and start at the top and go down show the overlapped region between the bottom electrode 34 and the variable resistive layer 36. Moreover, the first top surface 34b has a first width W1. The first bottom surface 36a has a second width W2. The first width W1 equals to the second width W2. The first width W1 is parallel to the second width W2. The first width W1 only partly overlaps the second width W2. According to a preferred embodiment of the present invention, 50% to 95% of the first width W1 overlaps the second width W2.

Please refer to FIG. 1 and FIG. 2. The top electrode 38 has a second bottom surface 38a and the variable resistive layer 36 has a second top surface 36b. The second bottom surface 38a contacts and entirely overlaps the second top surface 36b. Moreover, the second bottom surface 38a and the second top surface 36b have the same area and the same shape. That is, the top surface and the bottom surface of the top electrode 38, the top surface and the bottom surface of the variable resistive layer 36 and the top surface and the bottom surface of the bottom electrode 34 have the same shape and the same area. The top electrode 38 entirely overlaps the variable resistive layer 36. However, the bottom electrode 34 does not entirely overlaps the variable resistive layer 36, and does not entirely overlaps the top electrode 38. Instead, the bottom electrode 34 shifts laterally with respective to positions of the top electrode 38 and the variable resistive layer 36. In this way, because the contact area between the bottom electrode 34 and the variable resistive layer 36 become smaller but the operating current still maintains the same, when operating the RRAM 32, the current density of filaments generated between the bottom electrode 34 and the variable resistive layer 36 increases. The current density refers to the amount of charge per unit time that flows through a unit area. As current density increases, the operating efficiency becomes better.

A fourth drain metal layer M4a is disposed in the fourth metal dielectric IMD4. The fourth drain metal layer M4a covers and contacts the top electrode 38 of the RRAM 32. A third plug V3c and a fourth metal layer M4c are disposed in the fourth metal dielectric IMD4 within the logic device region L. The plug V3c covers and contacts the third metal layer M3c. The fourth metal layer M4c contacts and covers the third plug V3c.

According to a preferred embodiment of the present invention, a summation of the height of the RRAM 32 and the height of the fourth drain metal layer M4a equals to the height of the metal plug W.

The interlayer dielectric ILD, the first metal dielectric IMD1, the second metal dielectric IMD2, the third metal dielectric IMD3 and the fourth metal dielectric IMD4 may respectively be silicon oxide, silicon nitride, silicon carbide nitride, silicon oxynitride, silicon oxycarbonitride or a low-k dielectric having a dielectric constant smaller than 2.7. The substrate 10 may be a silicon substrate, a germanium substrate, a gallium arsenide substrate, a silicon germanium substrate, an indium phosphide substrate, a gallium nitride, a silicon carbide substrate or a silicon on insulator substrate.

The top electrode 38 and the bottom electrode 34 can respectively include titanium nitride, tantalum nitride, yttrium or other conductive materials. The variable resistive layer 36 includes multiple material layers such as tantalum oxide, hafnium oxide, titanium oxide or other metal oxides.

The drain plug 26, the source plug 28, the plug 30, the first drain metal layer M1a, the first source metal layer M1b, the first metal layer M1c, the first drain plug V1a, the second drain metal layer M2a, the first source plug V1b, the source line SL, the first plug V1c, the second metal layer M2c, the metal plug W, the second plug V2c, the third metal layer M3c, the third plug V3c, the fourth metal layer M4 and the fourth drain metal layer M4a can respectively be copper, aluminum or tungsten. According to a preferred embodiment of the present invention, the metal plug W is tungsten.

It is noteworthy that a summation of the height of the second plug V2c and the height of the third metal layer M3c equals to the height of the metal plug W. A summation of the height of the second plug V2c and the height of the third metal layer M3c equals to the thickness of the third metal dielectric IMD3. The height of the metal plug W equals to the thickness of the third metal dielectric IMD3. The thickness of the third metal dielectric IMD3 in the memory cell region M and the thickness of the third metal dielectric IMD3 in the logic device region L are the same. Moreover, a summation of the height of the third plug V3c and the height of the fourth metal layer M4c equals to a summation of the height of the RRAM 32 and the height of the fourth drain metal layer M4a. Furthermore, a summation of the height of the third plug V3c and the height of the fourth metal layer M4c equals to the thickness of the fourth metal dielectric IMD4. A summation of the height of the RRAM 32 and the height of the fourth metal layer M4a equals to the thickness of the fourth metal dielectric IMD4. The thickness of the fourth metal dielectric IMD4 in the memory cell region M and the thickness of the fourth metal dielectric IMD4 in the logic device region L are the same. That is, even the RRAM 32 is disposed in the fourth metal dielectric IMD4 in the memory cell region M, and the metal plug W is disposed in the third metal dielectric, the height of the metal interconnections (for example, the second plug V2c, the third meal layer M3c, the third plug V3c and the fourth metal layer M4c) in the third metal dielectric IMD3 within the logic device region L is still the same as the original design. In other words, the height of the metal interconnections does not to be adjusted to compensate the RRAM 32 and the metal plug W. In this way, the capacitance and the resistance of the metal interconnections in the logic device region L can maintain the original design.

FIG. 4 to FIG. 10 depict a fabricating method of an RRAM structure according to a preferred embodiment of the present invention. The steps illustrated in FIG. 4 to FIG. 10 are the fabricating method of the RRAM and the metal plug marked by a frame A in FIG. 1, wherein elements which are substantially the same as those in FIG. 1 denoted by the same reference numerals; an accompanying explanation is therefore omitted.

Figure 4:
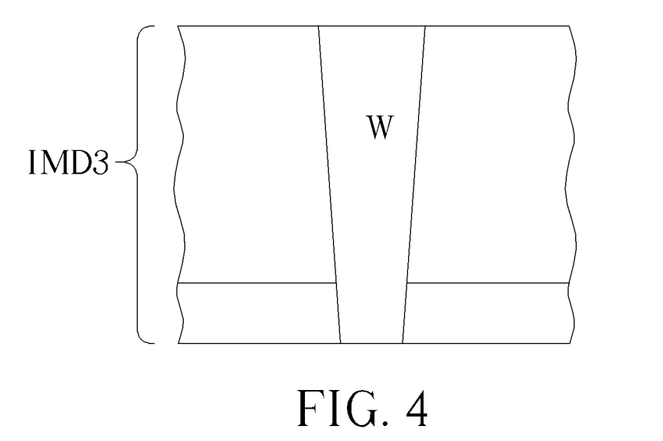
FIG. 4 depicts a metal plug disposed in a metal dielectric layer.
Figure 5:
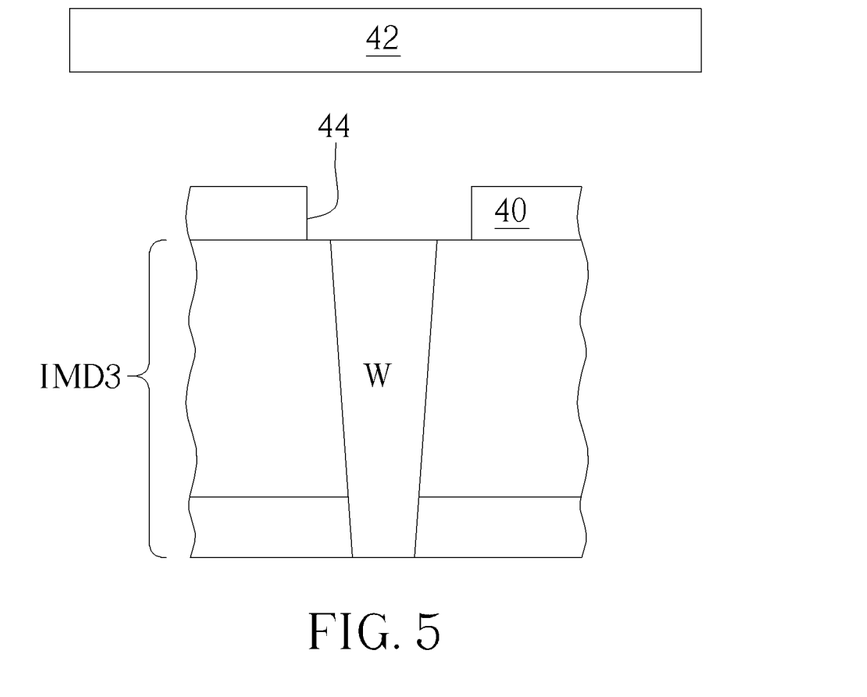
FIG. 5 depicts a stage following FIG. 4.
Figure 6:
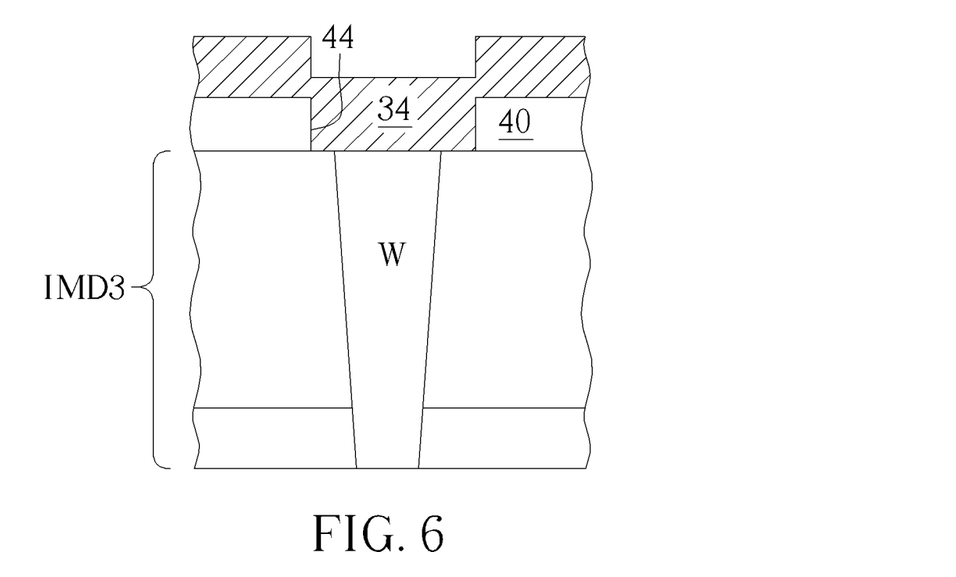
FIG. 6 depicts a stage following FIG. 5.
Figure 7:
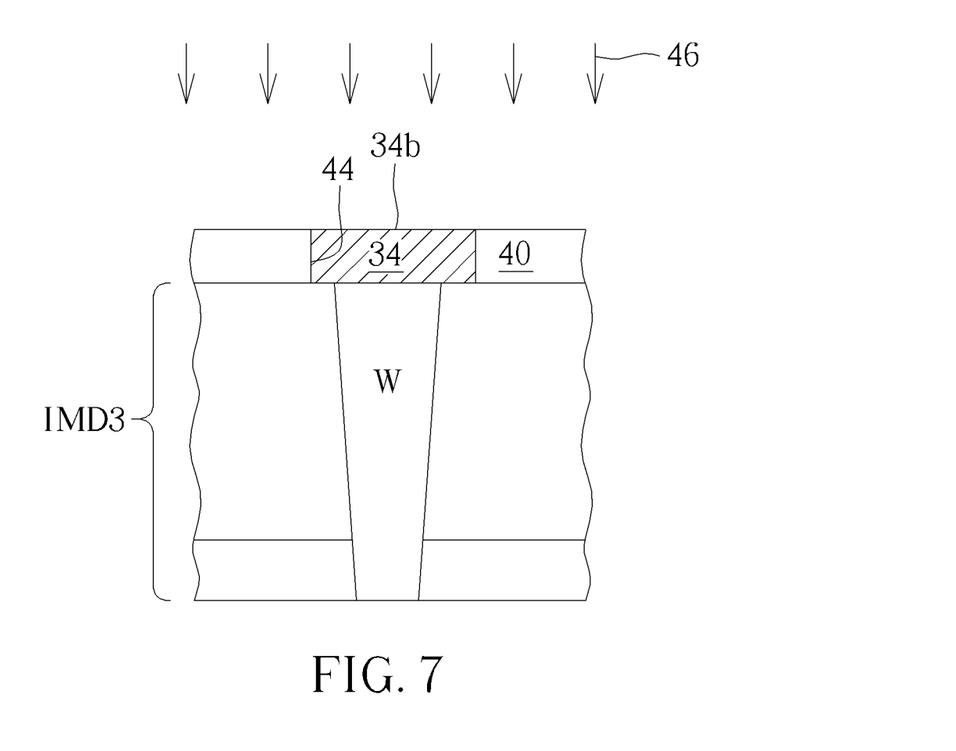
FIG. 7 depicts a stage following FIG. 6.

As shown in FIG. 4, a third metal dielectric IMD3 is provided on the substrate 10 (please refer to FIG. 1 for the position of the substrate 10). Later, a metal plug W is formed to penetrate the third metal dielectric IMD3. As shown in FIG. 5, a dielectric 40 is formed to cover the third metal dielectric IMD3. Next, the dielectric 40 is patterned by using a photomask 42. In other words, an opening 44 is formed in the dielectric 40 by a lithography and etching process, and the metal plug W is exposed through the opening 44. As shown in FIG. 6, a bottom electrode 34 is formed to cover the dielectric 40 and fill up the opening 44. As shown in FIG. 7, a planarization process 46 is performed to remove the bottom electrode 34 outside of the opening 44 to make the first top surface 34b of the bottom electrode 34 align with the top surface of the dielectric 40.

Figure 8:
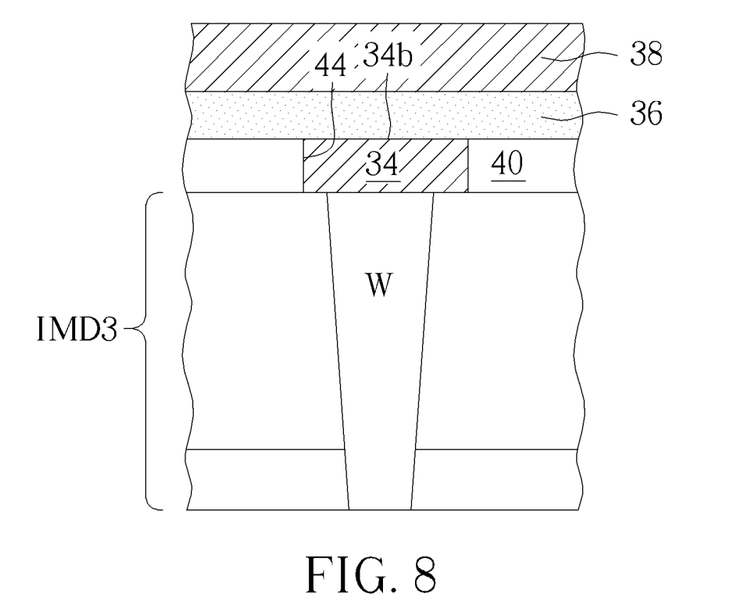
FIG. 8 depicts a stage following FIG. 7.
Figure 9:
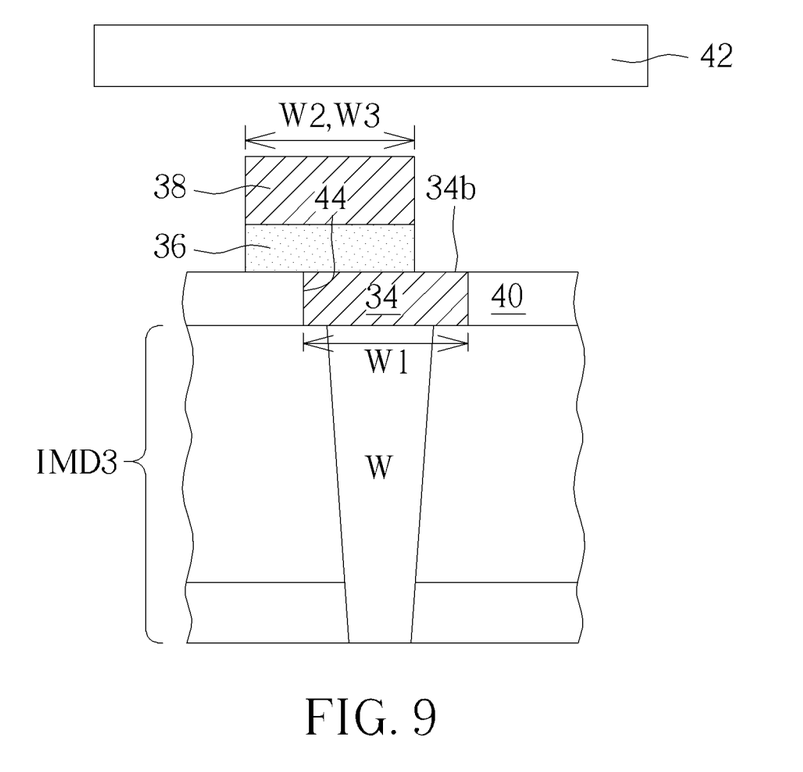
FIG. 9 depicts a stage following FIG. 8.

As shown in FIG. 8, after the planarization process 46, a variable resistive layer 36 is formed to cover the bottom electrode 34. The variable resistive layer 36 includes multiple material layers such as tantalum oxide, hafnium oxide, titanium oxide or other metal oxides. After that, a top electrode 38 is formed to cover the variable resistive layer 36 and the dielectric 40. As shown in FIG. 9, the variable resistive layer 36 and the top electrode 38 are patterned by using the photomask 42 to make the second width W2 of the variable resistive layer 36, the third width W3 of the top electrode 38 and the first width W1 of the bottom electrode 34 the same. It is noteworthy that the variable resistive layer 36 entirely overlaps the top electrode 38. However, the sidewalls of the variable resistive layer 36 and the sidewalls of the top electrode 38 do not align with the sidewalls of the bottom electrode 34. Even using the same photomask 42, the photomask 42 is at different locations of the substrate 10 while patterning the bottom electrode 34 and patterning the variable resistive layer 36 and the top electrode 38. In this way, as shown in FIG. 2, the variable resistive layer 36 includes a first bottom surface 36a, the bottom electrode 34 includes a first top surface 34b, the first bottom surface 36a and the first top surface 34b may have the same shape and the same area and the first bottom surface 36a only overlaps and contacts part of the first top surface 34b. The first top surface 34b and the first bottom surface 36a are coplanar.

Figure 10:
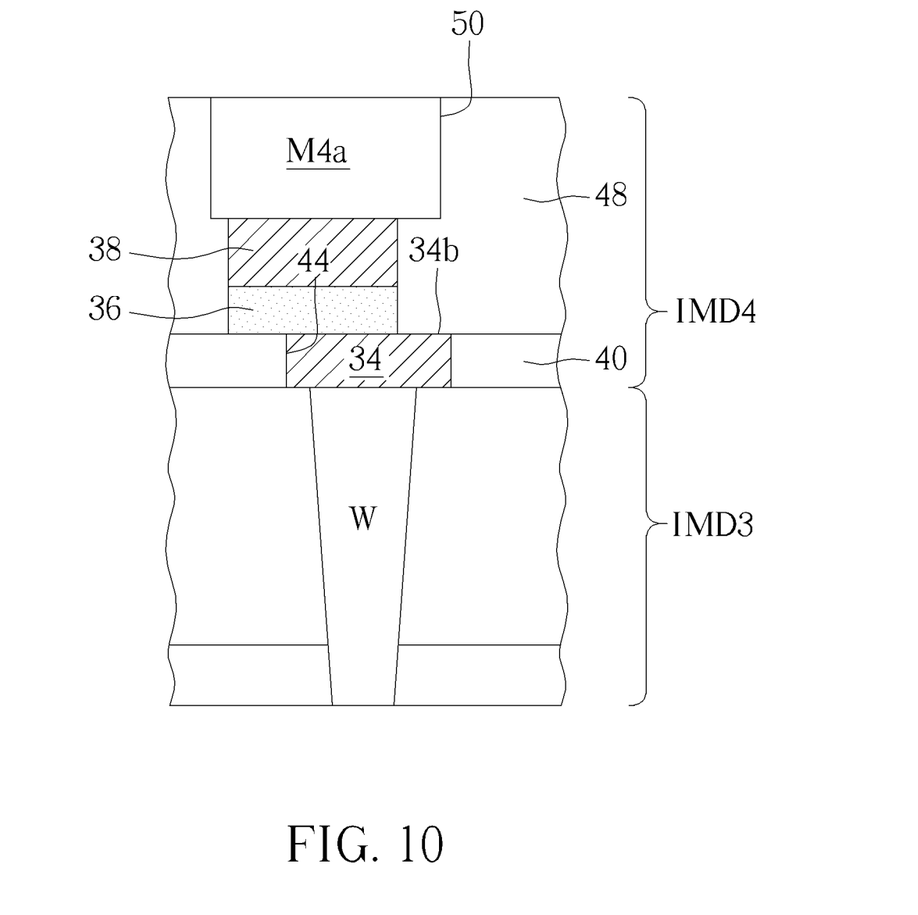
FIG. 10 depicts a stage following FIG. 9.

Now, the RRAM 32 and the metal plug W of the present invention are completed. As shown in FIG. 10, a dielectric 48 is formed to cover the dielectric 40. The dielectric 48 and the dielectric 40 form the fourth metal dielectric IMD4. Later, an opening 50 is formed in the dielectric 48. Next, a fourth drain metal layer M4a is formed to fill up the opening 50.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of an RRAM structure, comprising:
   providing a metal dielectric disposed on a substrate;
   forming a metal plug penetrating the metal dielectric;
   forming a dielectric covering the metal dielectric;
   forming an opening in the dielectric and exposing the metal plug from the opening;
   forming a bottom electrode covering the dielectric, wherein the bottom electrode fills up the opening;
   performing a planarization process to remove the bottom electrode outside of the opening;
   after the planarization process, forming a variable resistive layer covering the bottom electrode; and
   forming a top electrode covering the variable resistive layer, wherein the variable resistive layer has a bottom surface, the bottom electrode has a top surface, the bottom surface and the top surface are coplanar, the bottom surface only partly overlaps the top surface, and wherein the top surface has a first width, the bottom surface has a second width, the first width equals to the second width, the first width is parallel to the second width, the first width only partly overlaps the second width and 50% to 95% of the first width overlaps the second width.

2. The fabricating method of an RRAM structure of claim 1, wherein the steps of forming the opening comprise patterning the dielectric to form the opening by using a photomask.

3. The fabricating method of an RRAM structure of claim 2, wherein steps of forming the top electrode and the variable resistive layer comprise:
   after the planarization process, forming the variable resistive layer covering the dielectric and the bottom electrode;
   forming the top electrode to cover the variable resistive layer and the dielectric; and
   patterning the variable resistive layer and the top electrode by using the photomask to make a width of the variable resistive layer, a width of the top electrode and a width of bottom electrode of the same size.

* * * * *